US007198438B2

(12) United States Patent
Kosmowski

(10) Patent No.: US 7,198,438 B2
(45) Date of Patent: Apr. 3, 2007

(54) DRILLING SYSTEM WITH STATIONARY WORK TABLE

(76) Inventor: Wojciech B. Kosmowski, 26392 Calle Roberto, San Juan Capistrano, CA (US) 92675

( * ) Notice: Subject to any disclaimer, the term of this patent is extended or adjusted under 35 U.S.C. 154(b) by 543 days.

(21) Appl. No.: 10/821,443

(22) Filed: Apr. 9, 2004

(65) Prior Publication Data

US 2004/0202517 A1    Oct. 14, 2004

Related U.S. Application Data

(60) Provisional application No. 60/462,231, filed on Apr. 11, 2003.

(51) Int. Cl.
*B23B 39/16* (2006.01)

(52) U.S. Cl. .................. 408/51; 408/53; 408/95; 408/234; 409/235; 248/638; 248/678

(58) Field of Classification Search .......... 408/51, 408/53, 95, 97, 98, 234; 409/202, 235; 248/636, 248/638, 678; B23B 39/16, 39/18, 39/24, B23B 41/00; B23Q 1/25, 1/70
See application file for complete search history.

(56) References Cited

U.S. PATENT DOCUMENTS

| | | | | |
|---|---|---|---|---|
| 2,789,480 A | * | 4/1957 | Wellauer | 409/235 |
| 4,177,550 A | * | 12/1979 | Sipek et al. | 409/183 |
| 4,596,067 A | * | 6/1986 | Raiteri | 483/5 |
| 4,761,876 A | | 8/1988 | Kosmowski | |
| 4,813,825 A | | 3/1989 | Kosmowski | |
| 4,865,494 A | * | 9/1989 | Gudow | 408/13 |
| 5,068,958 A | | 12/1991 | Kosmowski | |
| 5,569,004 A | * | 10/1996 | Marantette | 409/235 |
| 5,799,924 A | * | 9/1998 | Slocum et al. | 248/636 |
| 5,876,156 A | * | 3/1999 | Yamaura et al. | 408/95 |
| 5,920,973 A | | 7/1999 | Kosmowski | |
| 6,227,777 B1 | | 5/2001 | Kosmowski | |
| 6,652,204 B2 | * | 11/2003 | Stengele et al. | 409/235 |
| 2005/0214084 A1 | * | 9/2005 | Baratta et al. | 408/111 |

FOREIGN PATENT DOCUMENTS

| | | | | |
|---|---|---|---|---|
| JP | 60114431 A | * | 6/1985 | |
| JP | 02131830 A | * | 5/1990 | |
| JP | 9-248724 | | 9/1997 | |
| JP | 11188693 A | * | 7/1999 | |
| JP | 2003266220 A | * | 9/2003 | |

OTHER PUBLICATIONS

1 Page Data Sheet, dated Jun. 1995, in Japanese.

* cited by examiner

*Primary Examiner*—Daniel W. Howell
(74) *Attorney, Agent, or Firm*—Larry K. Roberts

(57) ABSTRACT

A drilling system includes a stationary base table for supporting a work piece under process at a fixed position at a drilling spindle station. A drilling spindle carries and applies rotational force to a drilling tool. A compound overhead guiding system carries the spindle above the work piece under process. The overhead guiding system includes a Y drive system for moving the spindle along a Y axis in relation to the base table, and an X drive system for driving the spindle along an X axis. The guiding system has a lightweight laminated crossbeam structure for carrying the spindle and X axis drive system.

52 Claims, 13 Drawing Sheets

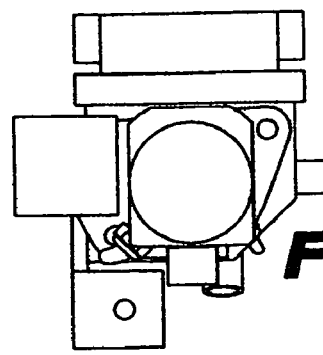
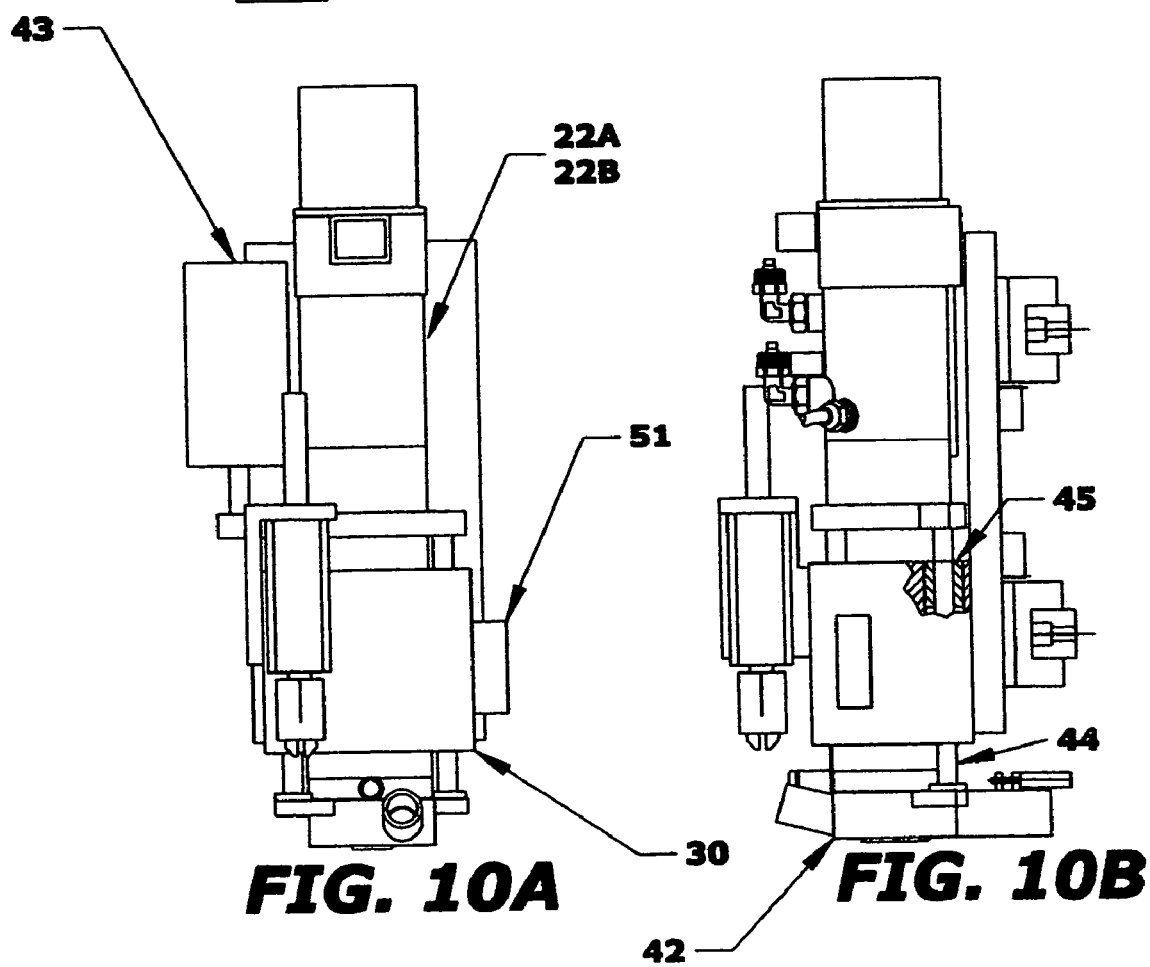
FIG. 10C
FIG. 10A
FIG. 10B

DRILLING SYSTEM WITH STATIONARY WORK TABLE

This application claims the benefit of U.S. Provisional Application 60/462,231, filed Apr. 11, 2003, the entire contents of which are incorporated herein by this reference.

BACKGROUND OF THE DISCLOSURE

There are two trends in new printed circuit board (PCB) designs. The first trend is the result of a continuous need for circuitry miniaturization. It requires high concentration of small holes to provide interconnections between layers of multi-layer designs. Many of today's high-density PCBs use holes in the range of 200 to 350 Microns diameter. However, new designs require holes in a 50 to 250 Micron diameter range. New types of multi-layer designs are thin (4 to 8 layers) and small in size and are produced on large panels in step-and-repeat fashion. A key to efficiently producing these new types of boards is in the ability of stacking them high in production without drill breakage and degradation of accuracy.

The second trend is for utilization of large motherboards, characterized by a high layer count, up to 50 layers. The size of these motherboard panels is large and relatively thick, e.g. up to 15 mm for some exemplary applications. These motherboards present an additional challenge to the drilling process because of a very high diameter to depth aspect ratio and large volume of copper, which has to be removed from the hole.

Existing drilling machines were not suited for these types of tasks. The amplitude of machine vibration can be too large for a reliable, small deep hole drilling process. The drilling process has to be slowed down to avoid drill breakage and pecking has to be implemented in the case of high diameter to depth aspect ratio drilling. This situation erodes productivity of machines and increases costs of drilling.

BRIEF DESCRIPTION OF THE DRAWINGS

Features and advantages of the disclosure will readily be appreciated by persons skilled in the art from the following detailed description when read in conjunction with the drawing wherein:

FIGS. 10A, 10B and 10C are respective front, side and top views of a drilling spindle for the system of FIG. 8.

DETAILED DESCRIPTION OF THE DISCLOSURE

Figure 1:
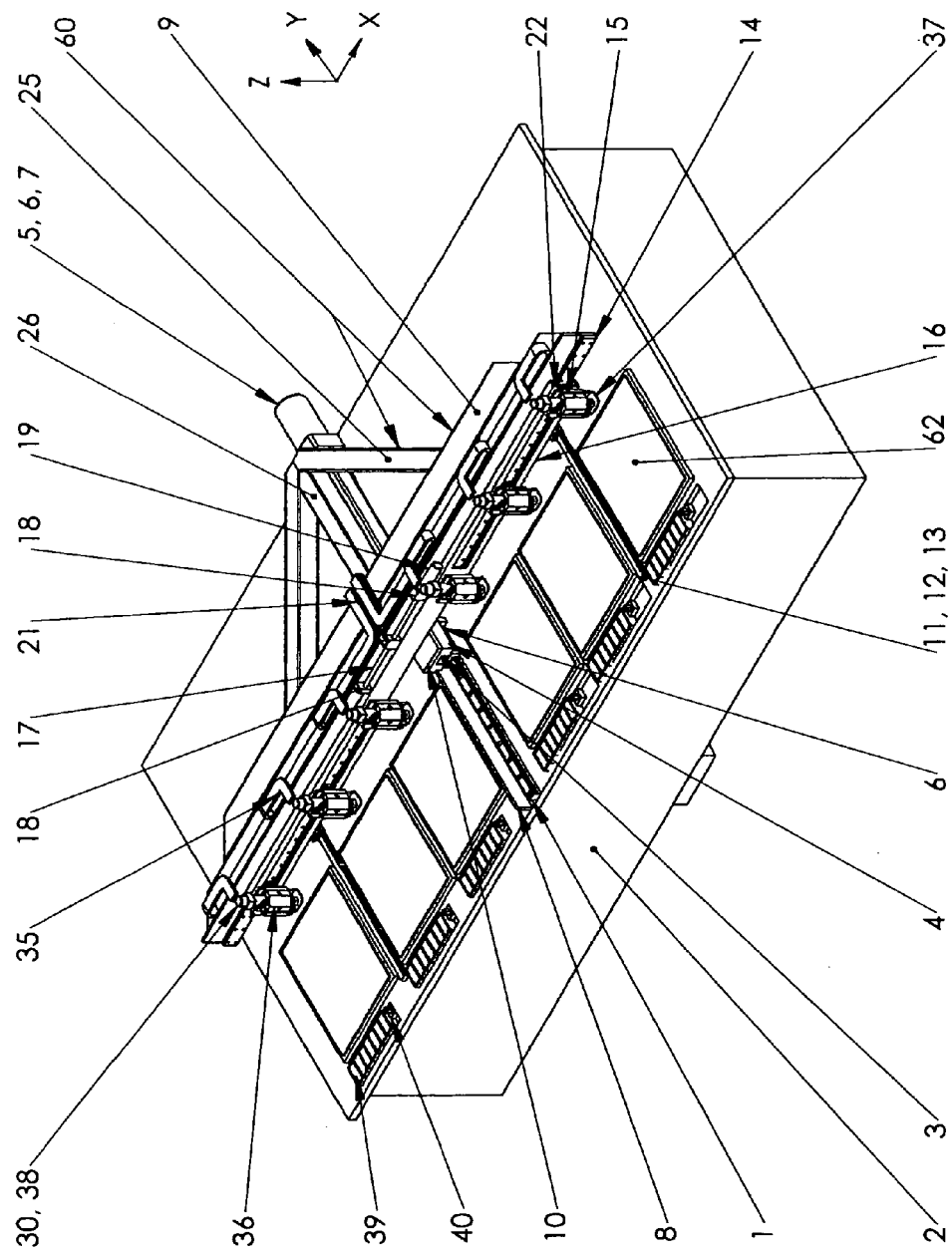
FIG. 1 is an isometric view of an embodiment of a drilling system.

In the following detailed description and in the several figures of the drawing, like elements are identified with like reference numerals.

Objectives of a new drilling system include one or more of the following: (I) the creation of a cost-effective solution for drilling of micro vias, e.g. in one application, in a 50 to 250 micron range, and high-aspect ratio holes in thick motherboards without pecking; (ii) reduction of the cost of drilling small and deep holes to provide a competitive edge for the customer; (iii) provide a relatively low-cost machine architecture; and (iv) increase drill life.

Figure 2:
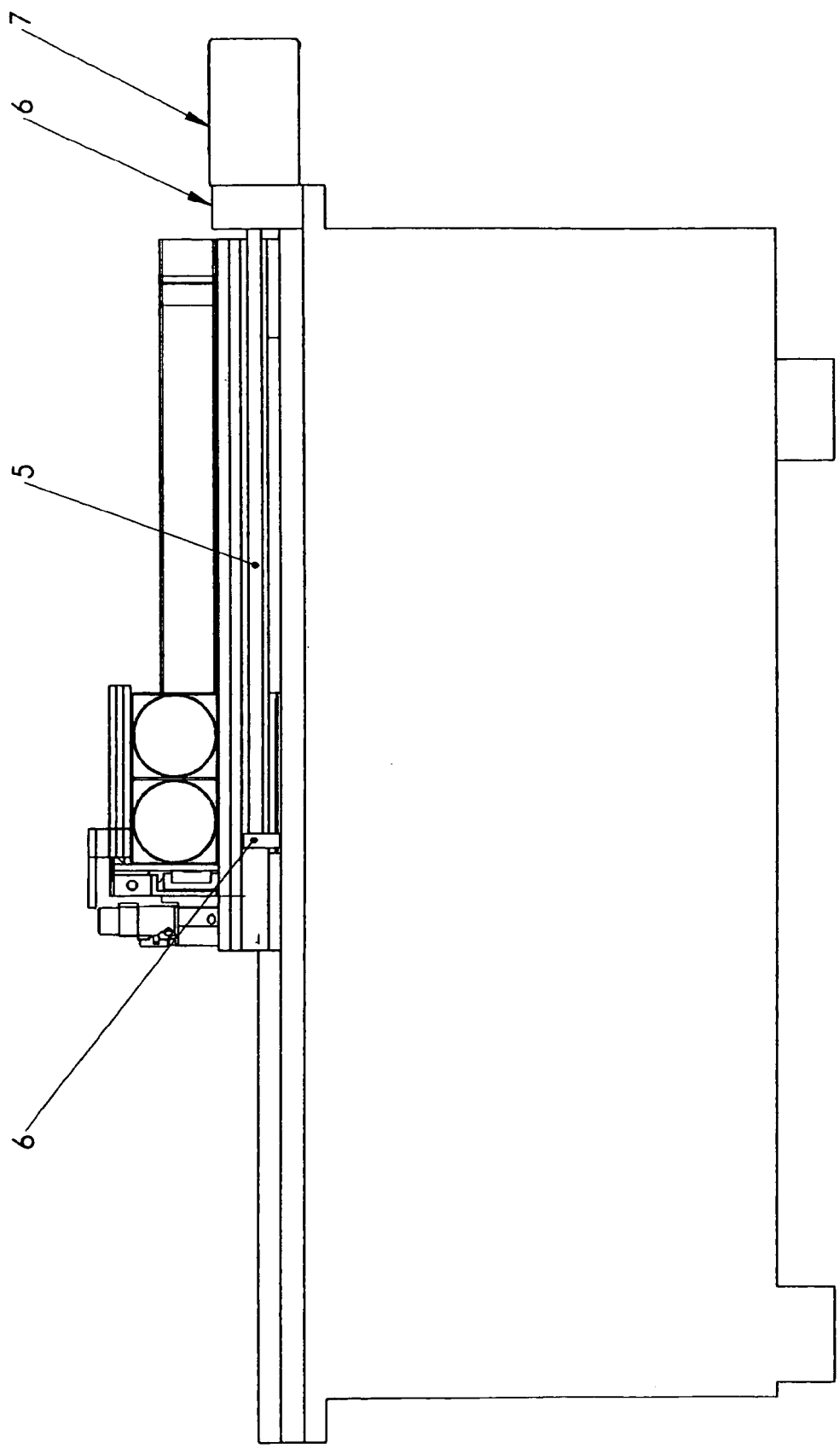
FIG. 2 is a cut-away side view of the system of FIG. 1, showing the Y-axis drive and T-bar structure in further detail.
Figure 2A:
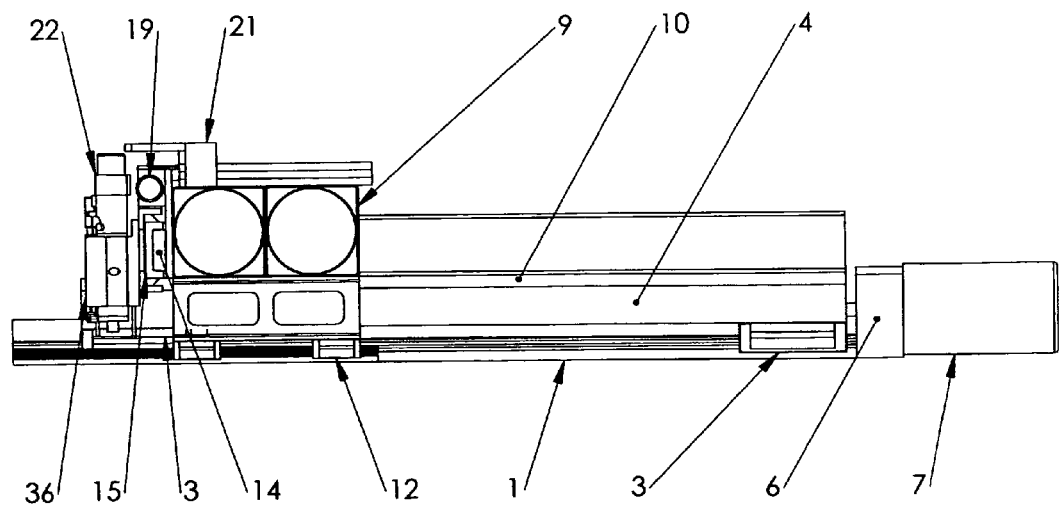
FIG. 2A is a close-up view, showing details of the X and Y drive.
Figure 2B:
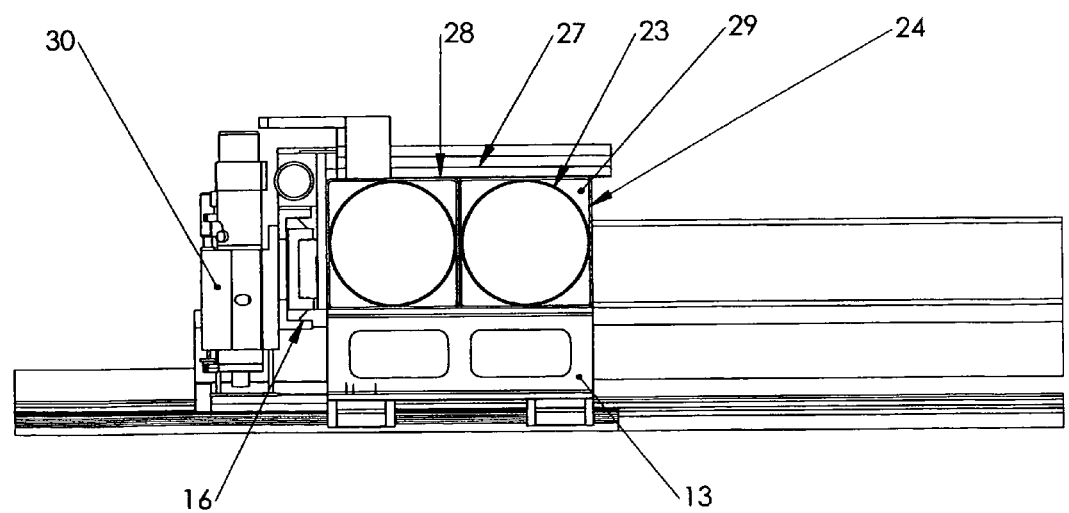
FIG. 2B is a further close-up view, showing details of the X and Y drive.
Figure 3:
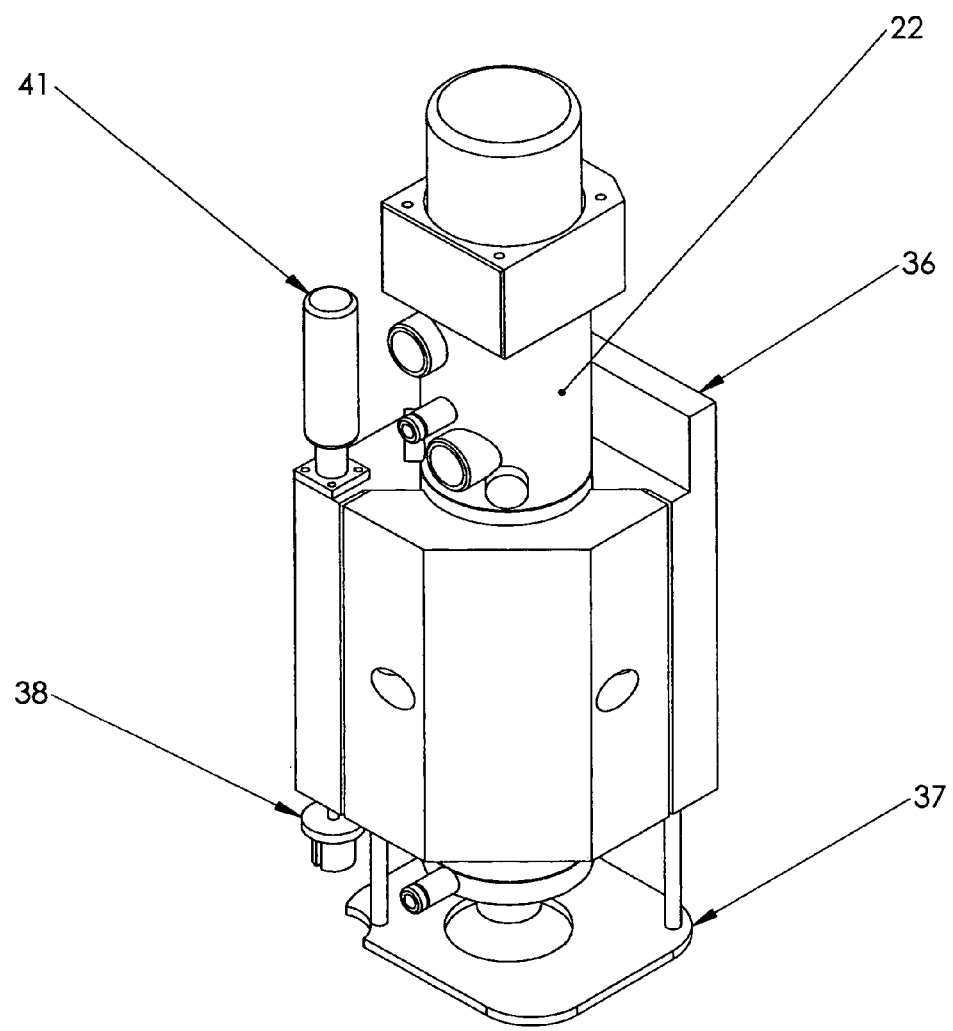
FIG. 3 is an isometric view of the Z-axis drive with pressure foot.
Figure 4:
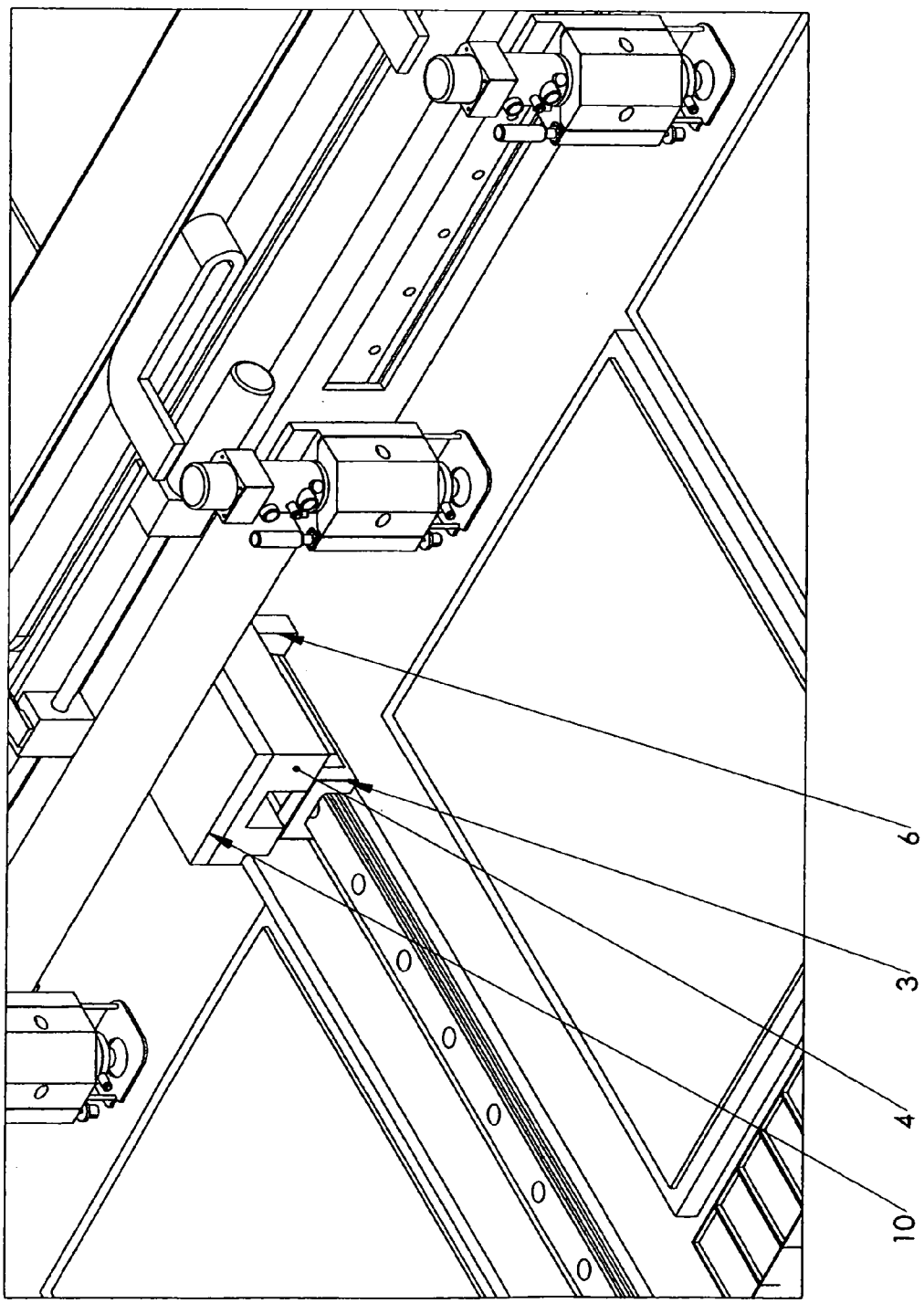
FIG. 4 is an isometric view, showing details of the X and Y axes drives.
Figure 5:
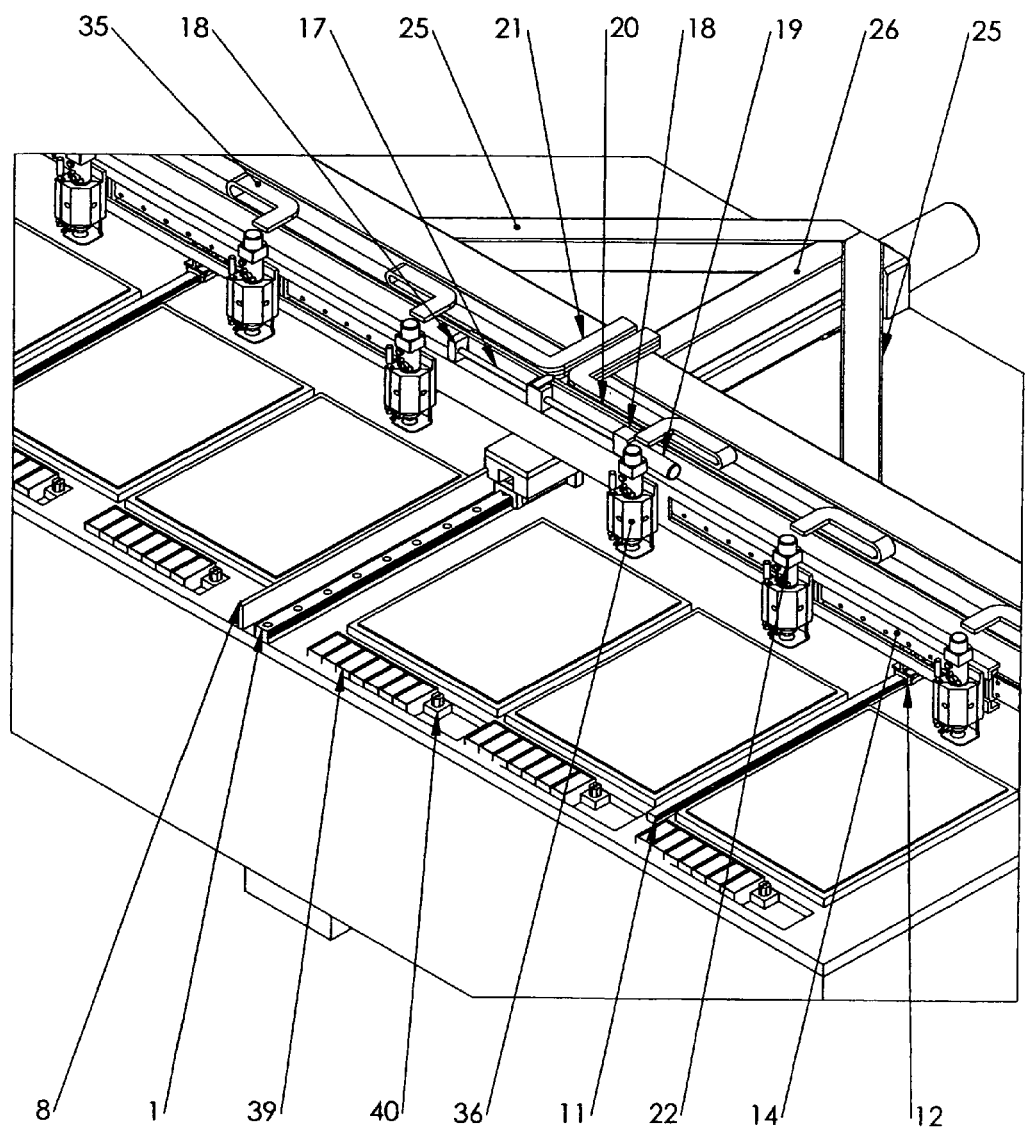
FIG. 5 is a close-up isometric view, showing details of the T-bar structure, spindles and the X-drive.

An exemplary embodiment of a drilling system is illustrated in FIGS. 1–6. The system includes a stationary table 2 which support the system elements. In this exemplary system, there are six stations 62 at which work pieces, e.g. a printed circuit board or stack of boards, are placed on backup pieces for drilling operations using the drilling spindles 22. This embodiment includes an lightweight T-bar structure 60 suspended above the drilled material which carries all three axes (X, Y, and Z) to perform the drilling function. The T-bar structure comprises a Y-slide or Y carriage 4 attached perpendicularly to an lightweight crossbeam 9 through a squaring plate 10 (FIGS. 2A–2B and 4). The T-bar structure is guided in the Y-direction by two linear bearings 3 mounted on the ends of the Y-slide.

The crossbeam 9 in an exemplary embodiment is constructed from thin-walled round steel tubing 23 inserted into square steel tubing 24 that is glued and spot-welded together. The round tubing has a cross-sectional configuration which has high strength against torsional forces. The square tubing has a configuration which has high strength against bending forces. The combination of the two lightweight structural elements has very high strength against torsional forces and bending forces, providing a high strength, very stiff structural assembly. In an exemplary embodiment, the tubing element 23 is fabricated of 0.060 inch thick steel tubing, and tubing element 24 of 0.078 inch thick steel tubing, although other thicknesses can be employed to meet the requirements of a given application. In this exemplary embodiment, the round steel tubing 23 is glued in place inside the square tubing 24 by a flexible adhesive, e.g. an adhesive marketed by 3M as the PP4G0 adhesive. It is desired that the sizes of the tubing structures 23 and 24 be selected so that the outer surface of the round tubing 23 is tangent to the inner surface of the square tubing 24. In an exemplary embodiment, the round tubing has a diameter of six inches, and the square tubing is sized accordingly. While preferably, the square tubing is formed of the appropriate size to permit the insertion of the round tube into it without cutting the square tube, one alternate construction technique is to cut the square tubing longitudinally to form two U-shaped structures. The round tubing can be fitted and glued into one U-shaped structure, and then the second U-shaped structure fitted and glued in place, butting the two U-shaped structures together at two longitudinal seams. One seam is located against the X-drive motor surface facing the front of the machine, the other seam facing the back. In this orientation, the tube walls receiving bending moments due to the Y-axis positioning movements are the other, intact tube walls.

In this exemplary embodiment, two sets of the round tube and square tube assemblies are glued side-by-side and spot-welded to create the lightweight beam structure as shown in FIGS. 2A–2B. The squaring plate 10 is welded to the bottom of this assembly. Two gossets 25 and a compression member 26 (FIG. 5) are glued and spot-welded to the back of the crossbeam to improve stiffness of the assembly. A vibration reduction plate 27 is attached to the top of the crossbeam assembly by an elastomer 28 (FIG. 2B) in order to reduce beam vibration during the positioning cycle. Characteristics of the plate and the elastomer, e.g. the plate thickness and the hardness and thickness of the elastomer, are tuned with the crossbeam mass to raise the natural frequency of the crossbeam assembly and dampen vibrations. This results is less stress to the drill bits, and allows the speed of positioning movements to be increased.

In this exemplary embodiment, voids between the round tubing 23 and the corners of the square tubing 24 can be filled in with dampening material 29, and this provides an acoustic dampening function. An exemplary dampening material is marketed as VIBREDAMP™ dampening material, by Philadelphia Resins, although many other materials can be used as well.

The laminated construction of the crossbeam, with a structure providing high strength against torsional moments laminated to a structure which provides high strength against bending moments, provides a structure which is very light and very stiff.

It will be appreciated that other lightweight, high stiffness crossbeam assemblies can alternatively be employed. The crossbeam structure should have an improved stiffness-to-weight ratio, in comparison to traditional constructions, such as cast iron or steel crossbeams. For example, tubing elements constructed of graphite or carbon fiber structures can be employed instead of steel tubing. The crossbeam could be constructed of a laminated honeycomb structure. Other structures can alternatively be employed.

The Z-axes drive elements, including the drilling spindles 22 mounted to spindle bodies 30, are guided for movement along the X-axis by a single X-rail 14 that is attached to the face of the crossbeam 9. The X-rail is perpendicular to the Y-carriage 4, which creates the T-bar configuration. This architecture simplifies the machine configuration and significantly reduces the number of components required for machine functions. The reduction of the number of parts can also contribute to overall cost savings. Major assemblies normally associated with three axes drilling machines, such as the top table, stationary overhead beam and uprights, are not employed in the embodiment of FIGS. 1–6.

In one exemplary embodiment, lightweight miniature Z-Axis drives 22 each with a high RPM spindle and low impact pressure foot are employed. Reciprocating spindles reduce moving mass. Reciprocating spindles suitable for the purpose are described, for example, in U.S. Pat. No. 6,227,777 B1, the entire contents of which are incorporated herein by this reference.

In an exemplary embodiment, the architecture of the drilling machine can reduce the footprint of the machine. Acceleration feedback systems can be employed to reduce jerk during positioning cycles. The architecture employs a combined X-Y-Z axes guiding system.

A goal for lightweight structures is to improve positioning speed without losing positional accuracy and at the same time reduce the vibration level of moving components. Lightweight construction in an exemplary embodiment can substantially reduce the weight of all three moving axes. Because of the reduced weight, the energy required to move a lightweight axis is also reduced, e.g. in one exemplary embodiment to ⅕th the energy of conventional designs. Of course, other embodiments of a machine may provide lesser or greater weight advantages. Therefore, the shockwave induced to the machine structure is substantially smaller, which contributes to an increase of machine stability. The cube of machine dynamic stability is reduced to provide an improved environment for small and deep hole drilling. By using this approach, a machine architecture can be employed where the drilled material is stationary, resting on the base table of the machine, and all three movement axes are built in to the compound overhead guiding system that carries the spindles above the drilled material.

The exemplary embodiment of a drilling system illustrated in FIGS. 1–6 employs lightweight structures that are characterized by low moving mass combined with high stiffness, and are designed for minimized vibrations in operating frequencies. Vibration dampening is accomplished by multi-piece construction connected to each other through an elastomer 28 and by dampener material 29 (FIG. 2B). This type of construction allows dramatic changes in machine configuration where the drill material is stationary on the base table and the X-Y-Z axes move above it to perform all drilling functions. Heavy compound axes would be unstable at drilling machine operating speeds. The improved dynamics of the system leads to increased drilling bit life as well.

In an exemplary embodiment, the Y-axis carriage 4 moves front-to-back and is guided by a single rail 1 attached to the center of the base table 2. Two linear bearings 3 are connected to the Y-axis carriage 4 and are driven by a lead screw 5 located above the centerline of the guiding rail. The lead screw is mounted through preloaded angular contact thrust bearings 6 to the base table and is propelled by an A/C servo motor 7. Alternatively, linear motors can be used in the X and Y axes, as described below with respect to an alternate embodiment. Position feedback is provided by a linear scale 8 mounted on the base table parallel to the guiding rail. The X-axis carriage in this exemplary embodiment is in the form of a lightweight crossbeam 9 coupled to the Y-axis carriage through a squaring plate 10. There are two support rails 11, one on each side of the Y rail 1 with two bearings 12 on each guiding rail where the bearings are mounted to the X crossbeam through flexible in X direction brackets 13. A low profile X guiding rail 14 is mounted on the face of the crossbeam.

A single ball slide 15 is used to carry each Z-axis assembly on the guiding rail 14. There are six ball slides for a six spindle machine. A machine can of course include fewer or more spindles. The ball slides are connected to each other by L-brackets 16 to increase stiffness of guiding and reduce crabbing. All ball slides are propelled by a single lead screw 17 located above the slides, in the crossbeam's center of gravity. The X-axis lead screw 17 is captured by two pairs of preloaded angular thrust bearings 18 attached to the lightweight crossbeam 9. The A/C servo motor 19 propels the lead screw to provide X-axis motion. Position feedback is provided by a linear scale 20 mounted parallel to the lead screw on the top of the crossbeam.

In this exemplary embodiment, the Y-axis drive is attached through the X-axis carriage's center of gravity, in mid-stroke position of the X-axis travel, to minimize moments acting on the Y guiding system. It is contemplated, for an exemplary preferred embodiment, that the respective drilling stations 62 will be distributed on either side of the intersection of the Y-axis carriage and the X-axis carriage, so that an even number of stations are deployed, one half on each side of the intersection point with pairs of the stations spaced at equal distances from the intersection point. This will tend to reduce moments on the T-bar structure 60 during positioning cycles.

Electrical cables 21 and pneumatic connections are routed through cable tracks running from the Z-axis to the X-axis crossbeam and routed from it to the overhead compartment of the machine.

In an exemplary embodiment, substantial cost savings can be realized by the reduced number of components required to create the three-axes movement. Only four rails and twelve linear bearings are used to create an X-Y-Z guiding system for one exemplary embodiment of a 6-station machine in comparison to eighteen rails and thirty-eight linear bearings used in some conventional designs. Elimination of the top table, overhead beam and uprights as in an exemplary embodiment of the system contributes to substantial cost reduction. Machining of the parts can be simpler, therefore, cost effective. Also, the amount of material can be reduced to contribute to further cost savings. The size of the X and Y lead screws can be smaller in comparison to those used in conventional machines due to significant reduction of the moving mass.

As noted above, a high RPM reciprocating spindle is used in an exemplary embodiment to maximize the efficiency of drilling and improve Z drive dynamics. An exemplary spindle is described in U.S. Pat. No. 6,227,777 B1. In this reciprocating spindle, the rotor shaft rotates and moves in the Z direction on the same set of air bearings. A rotary motor provides rotary motion of the spindle rotor, and a linear motor provides axis force to drive the rotor along its axis. All wires and pneumatic connections are brought out from the side of the reciprocating spindle body and are routed through the cable track 35 to the X-axis crossbeam. The spindle body is mounted on the X-axis slide through the adapter block 36 which also houses a pressure foot assembly 37 and a drill bit pickup device 38 (FIG. 3).

Alternatively, a Z-axis design using non-reciprocating shaft, small high RPM conventional spindle with built-in Z axis drive can also be used with this machine architecture.

A conventional pressure foot travels ahead of the drill bit with the spindle assembly, where two cylinders keep it in the most forward position, with full clamping pressure applied to the cylinders. As the spindle travels towards the material, the pressure foot impacts it with full clamping force at the speed of the Z-axis feed rate, before the drill enters the material. Impact of the pressure foot against the drilled material sends shock waves through the Z-axis and this situation can be harmful to small hole drilling. In contrast, with the low impact pressure foot 37, there is very low pressure behind the cylinders keeping the pressure foot in the forward position until the pressure foot makes contact with the work piece, e.g. a stack of boards. The contact of the pressure foot with the surface of the work piece triggers an increase of pressure in the pressure foot cylinders to provide a clamping force. This approach eliminates the hammer effect and does not generate shock waves, which contributes further to the improvement of machine dynamics. The pressure foot movement is independent of spindle movement and the pressure foot pressure is not absorbed by the spindle drive mechanism, but rather by the guiding rail.

Tool changer magazines 39 are mounted on the base table and, in an exemplary embodiment can be a commercially available magazine, e.g. a 50 pack magazine. The drills are stationary; therefore, they do not add to the weight of the moving components. Every station is equipped with a gripper 40 and retrieving mechanism 41 which takes drill bits from the magazine and puts them to the gripper to be inserted into the spindle collet. The gripper also retrieves drill bits from the spindle and passes them to the retrieving mechanism to be placed back in the magazine.

Figure 6:
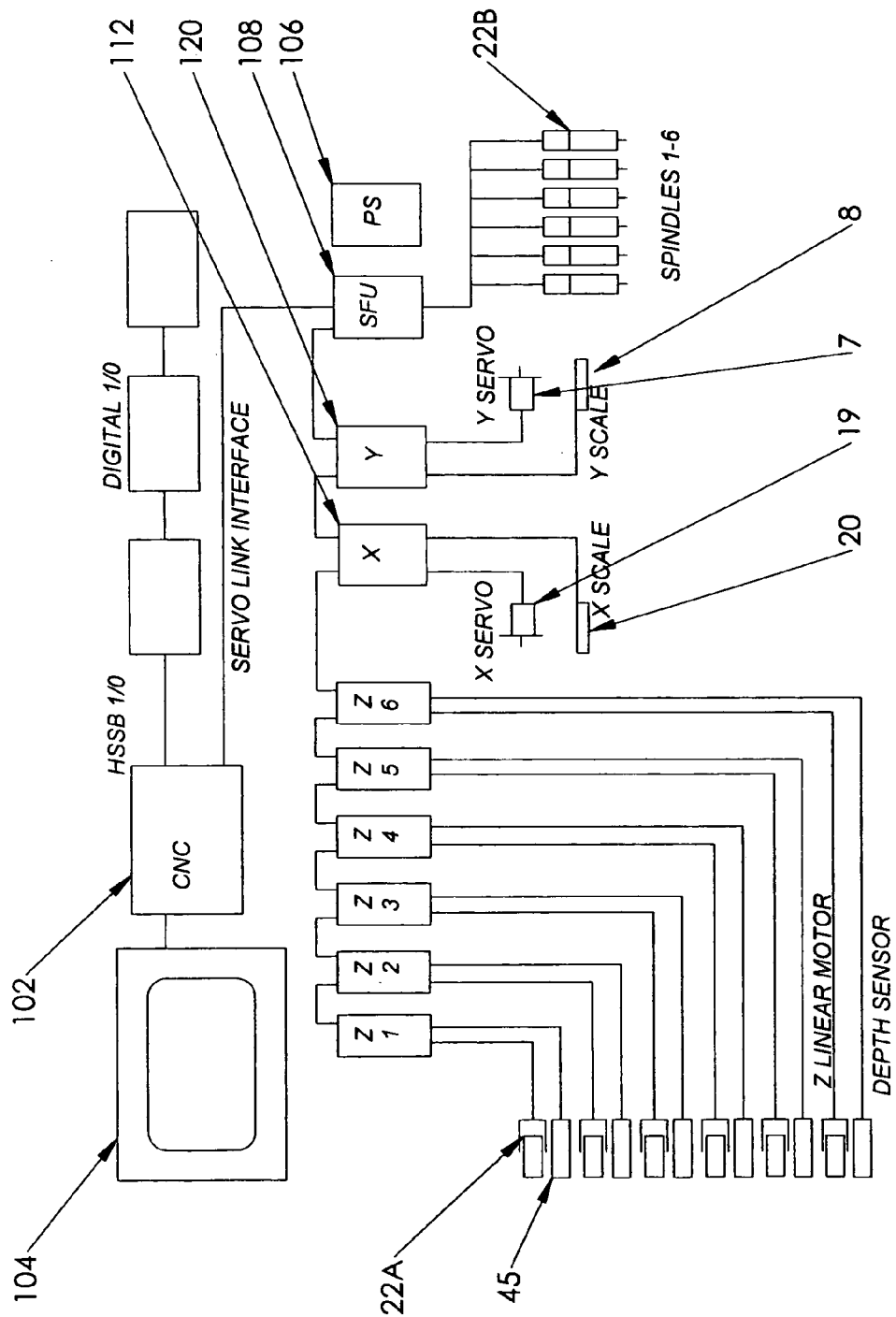
FIG. 6 is a schematic diagram of control elements of the system of FIGS. 1–5.

FIG. 6 is a schematic diagram of control elements of the system of FIGS. 1–5. Control is provided by a CNC controller 102. Controllers suitable for the purpose are commercially available. A display monitor and a keyboard (generally indicated as 104) are provided to facilitate user interaction. The CNC controller provides commands and receives data from the controlled elements of the machine. In this embodiment, a power supply 106 provides power to the system. A frequency converter 108 provides rotary drive power to the Z axis spindle rotary motors 22B. The control system includes, for the X axis, the X-axis drive amplifier 112, the X servo motor 19 and scale 20, and, for the Y axis, the Y axis amplifier 120, the Y servo motor 7 and scale 8. Each of the six spindles (Z1–Z6) include a rotary motor 22B, a linear motor 22A, a Z servo (with velocity and position feedback) and a depth sensor 46. The depth sensor can be used to detect the location at which the pressure foot sensor is assumed to contact the work piece. Alternatively, a switch or sensor can be used to detect contact and actuate a linear actuator to actuate the pressure foot. Various types of linear actuators can be employed, e.g. pneumatic, variable pressure actuators and solenoids.

Figure 7:
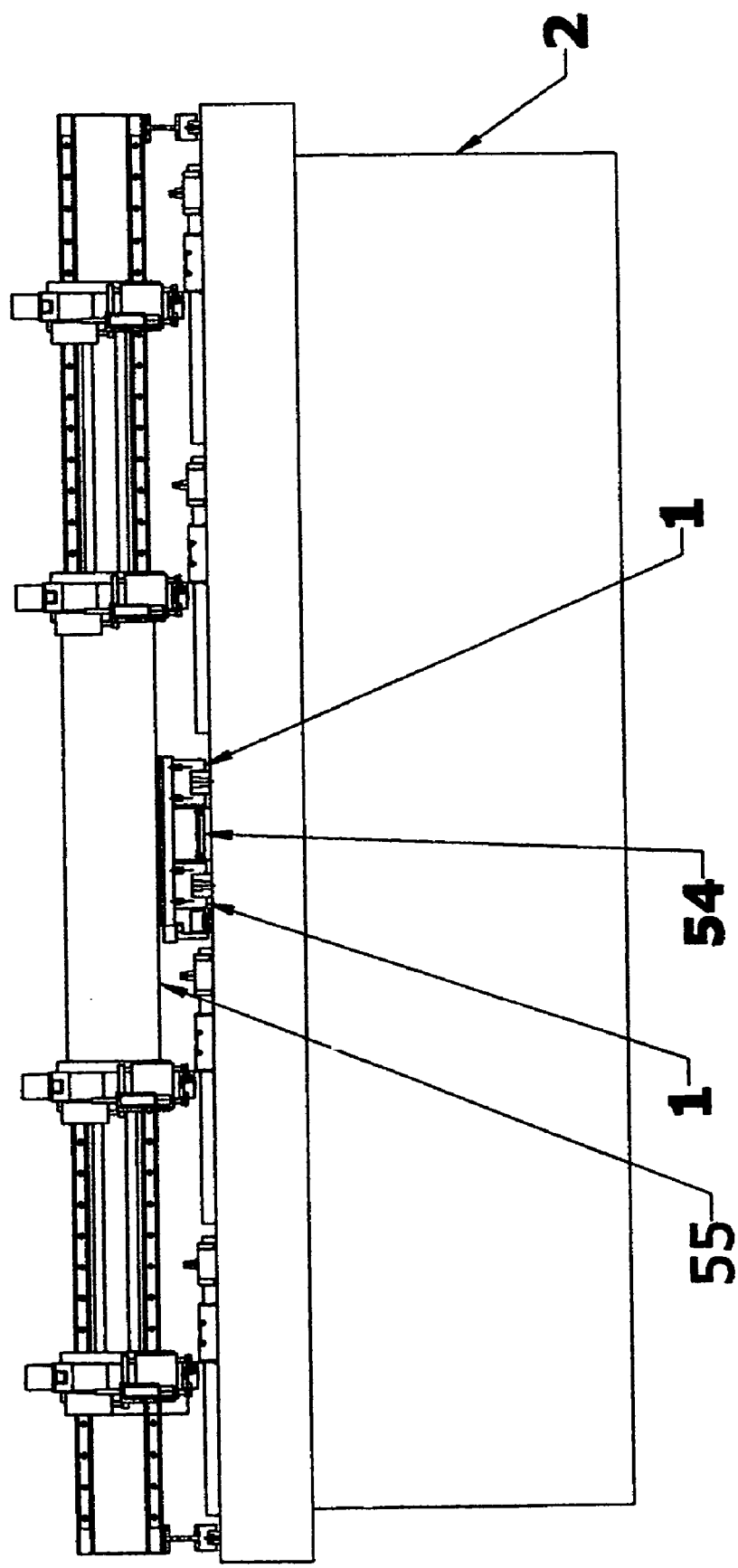
FIG. 7 is a front view of an alternate embodiment of a drilling system.
Figure 8:
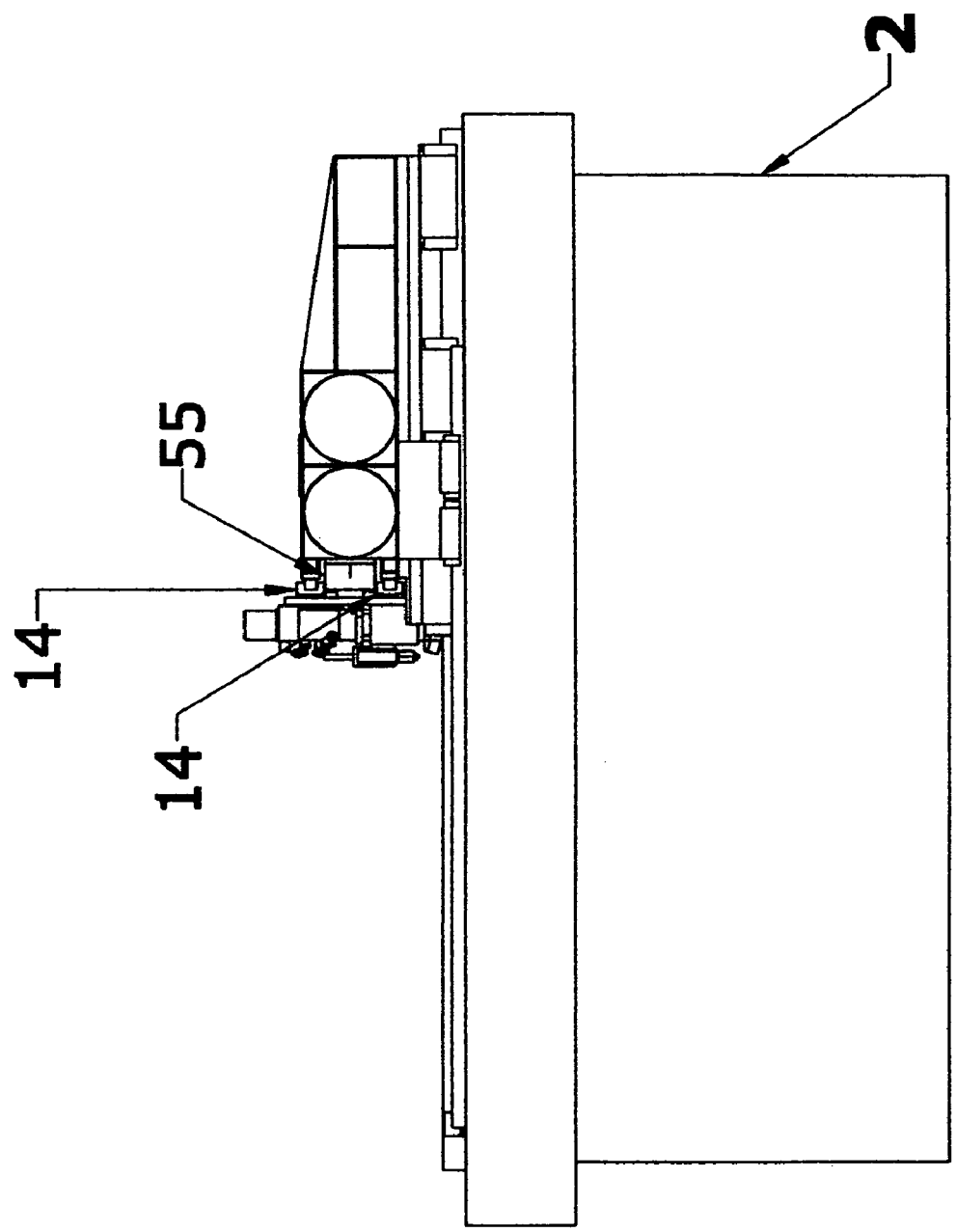
FIG. 8 is a side view of the drilling system of FIG. 8.
Figure 9:
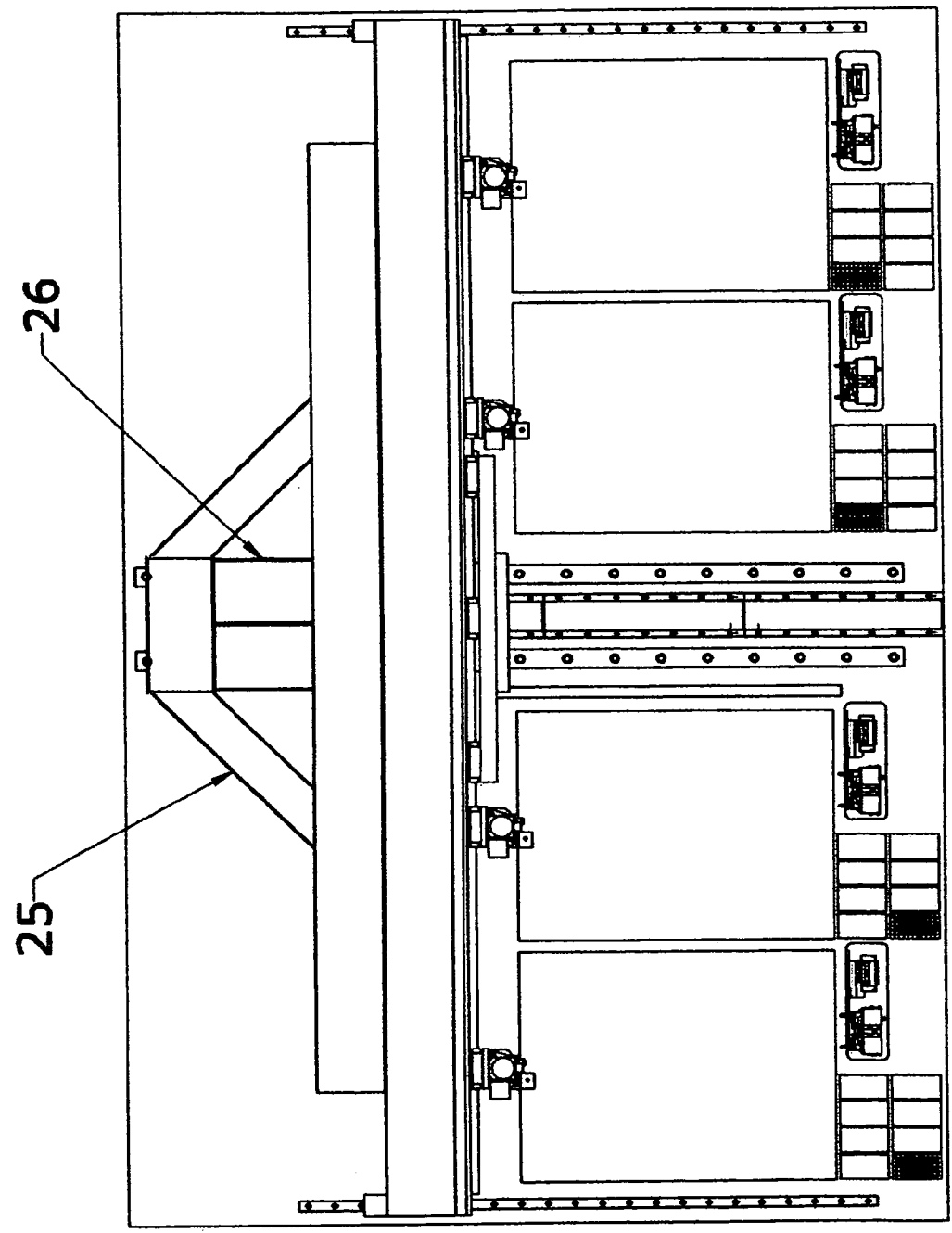
FIG. 9 is a top view of the drilling system of FIG. 8
Figure 11B:
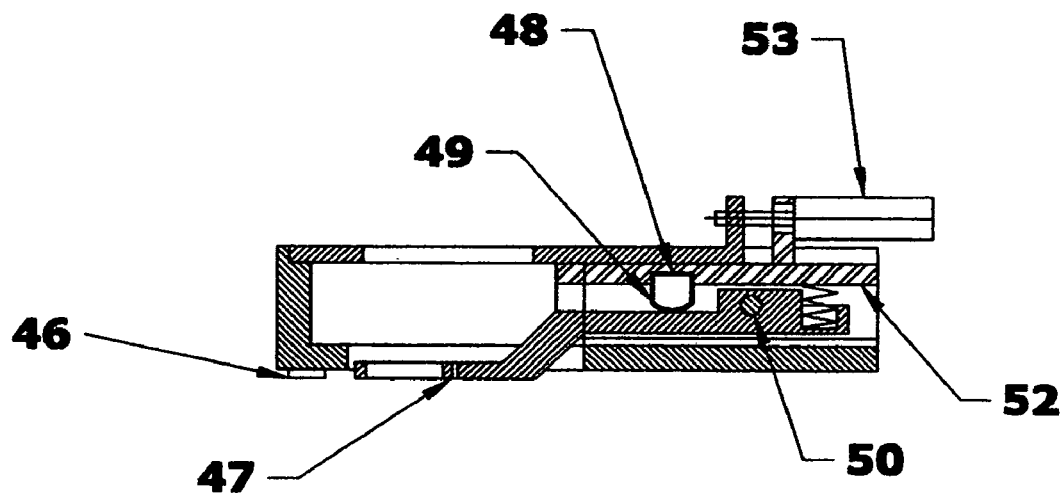
FIG. 11B is a cross-sectional view taken along line A—A of FIG. 11A.
Figure 11A:
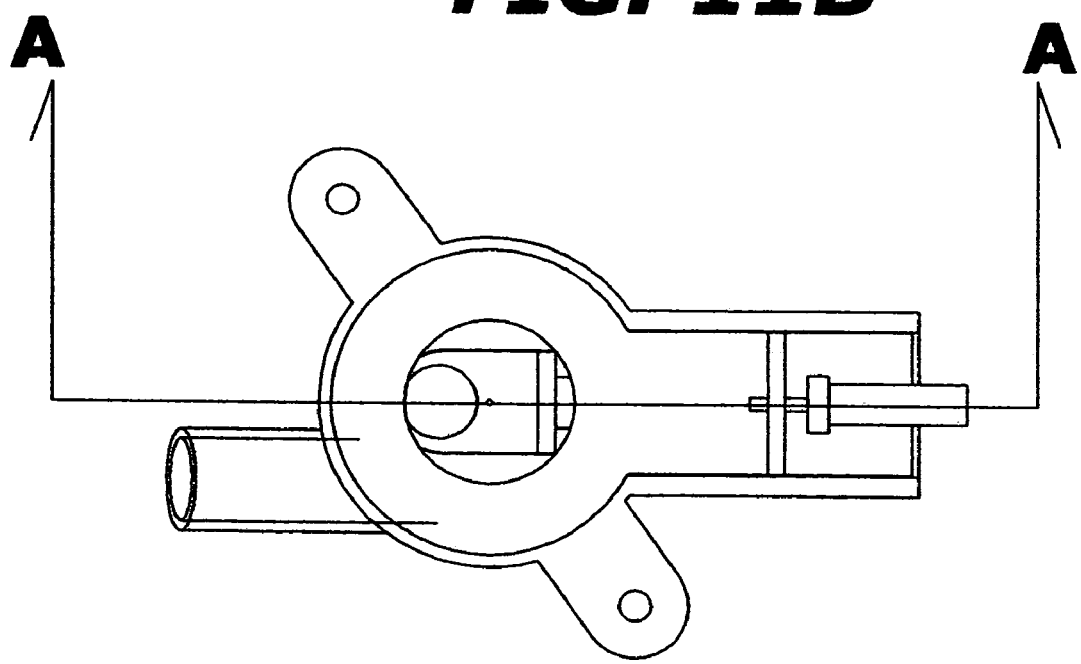
FIG. 11A is a diagrammatic top view of a pressure foot apparatus of the system of FIG. 8.
Figure 11C:
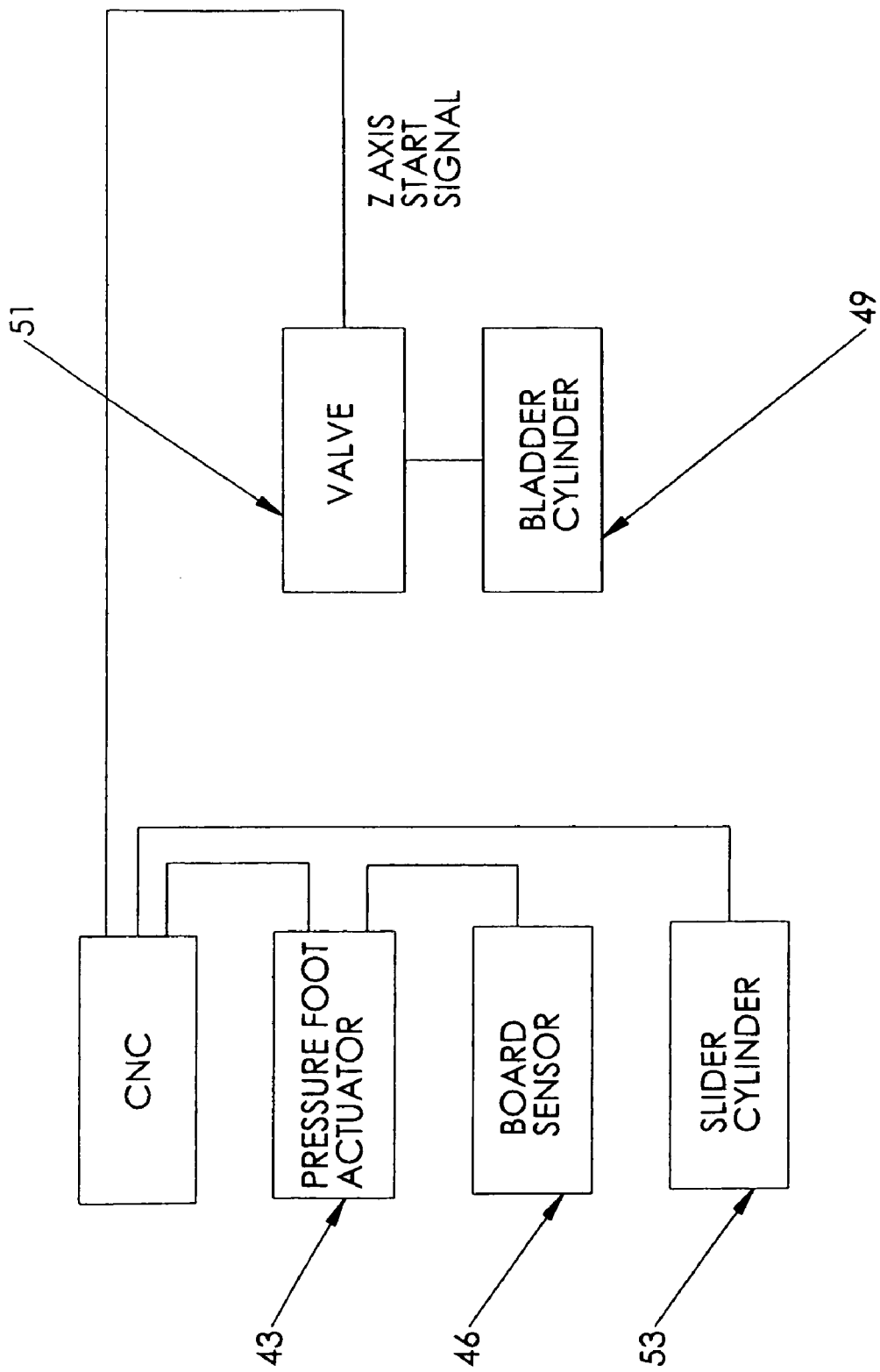
FIG. 11C is a simplified control diagram illustrating the control elements for a low impact pressure foot.

A second embodiment of the system utilizes linear motors for drive in the X and Y axes. This allows an increase in positioning speed and axes acceleration which may contribute to a further increase in machine productivity. FIGS. 7–11C depict the exemplary second embodiment. FIG. 7 is a front view of the system. FIG. 8 is a side view. FIG. 9 is a top view. FIGS. 10A–10C illustrates the Z-axis configuration and FIGS. 11A–11C illustrate features of the low impact pressure foot.

Following are the primary differences between the embodiment of FIGS. 1–6 and that shown in FIGS. 7–11C. In the Y-axis, the lead screw 5, the thrust bearing 6 and the A/C servo motor 7 of the embodiment of FIGS. 1–6 are replaced by a linear motor 54. Linear motor systems suitable for the purpose are commercially available; by way of example only, linear motors marketed by ETEL Motion Technology, as the LMC line of linear motors can be utilized. Other linear motors can also be employed. A second guiding rail 1 is added on the right side of the Y linear motor 54. In the X-axis, the lead screw 17, thrust bearing 18 and A/C servo motor 19 are replaced with an X-axis linear motor 55. A second guiding rail 14 is added to the X-axis guiding system to support the linear motor operation. In addition, a water-cooling system can be provided with the linear motors to maintain constant temperature of the machine during operation. Linear motors with water-cooling systems are commercially available. This exemplary embodiment also reduces the number of spindles from six to four in order to improve drilling accuracy and machine dynamics.

In the low impact pressure foot 42, the pressure foot does not move with the spindle. An independent mechanism 43 is connected to the spindle mount 30, and moves the pressure foot 42 up and down relative to the spindle mount. The pressure foot 42 is guided on two rods 44 moving in four bushings 45 on the spindle housing 30. The pressure foot has a sensor 46 mounted in the face of it to detect drilled material before contact. At the beginning of the drill cycle for a given work piece, the pressure foot is brought down to close proximity of the drilling material determined by the sensor 46. The sensor 46 can be an optical, pneumatic, proximity or other type of sensor. In an exemplary embodiment, the pressure foot 42 typically remains in the down position until the drilling on the work piece has been completed, and is then lifted by mechanism 43.

In this exemplary embodiment, the pressure foot has a built-in pneumatically actuated clamp 47, which provides the clamping function to the work piece material during the drilling cycle. This clamping function can also be performed by a solenoid or linear motor. A cylinder 48 utilizing a bladder 49 to compensate for a change of angle during the clamping process performs the pneumatic actuation. The clamp is very light and is pivoted on a pin 50 in the body of the pressure foot; therefore it has very low inertia and minimum travel to eliminate the impact during clamping. In an exemplary embodiment, the pressure foot assembly 42 is positioned very close to the work piece surface, e.g. 0.020 inch or less, by the mechanism 43. The clamp travel is on the order of this spacing distance. A high-speed valve 51 is mounted on the adapter block 36 and is actuated by the Z-axis stroke signal provided by the CNC controller 102. The valve pressures the bladder with air when actuated, and releases air from the bladder when the valve is released. This mechanism is fast enough to provide the clamping before the drill bit enters the material. The clamp is lifted as the drill bit leaves the material after completing the hole, at a predetermined time before the end of the Z-axis stroke.

The clamping mechanism, which is mounted in the pressure foot on the slider 52, has two positions, forward and retract, controlled by a cylinder 53. The forward position is for drilling where the clamp has a small hole opening to ensure adequate pressure during the drilling cycle. In the back position, the clamp has a large opening to accommodate a tool change. The clamp is moved to the retract position during a tool changing operation.

A difference between a conventional pressure foot and this embodiment of a low impact pressure foot is that the main body of the pressure foot 42 is stationary during the drilling operation, and only the clamp element 47 applies the pressure to the material eliminating the pressure foot impact harmful to the drilling process. In this exemplary embodiment, the bladder cylinder, which takes time to fill up, accomplishes the process of eliminating impact therefore providing a motion without force until the finger rests on the drilled material and the pressure in the bladder builds up to the maximum.

FIG. 11C is a schematic block diagram of the control devices for the pressure foot 42. These include the sensor 46, whose signal is provided to the CNC controller 102 which uses the sensor signal to control the pressure foot Z-axis actuator 43. When it is time to start a drilling sequence on a work piece, the CNC controller 102 actuates the actuator 43 to lower the pressure foot 42 toward the work piece surface. The sensor 46 provides a signal indicating that the pressure foot is some predetermined distance above the surface, e.g. 0.020 inch or smaller, and the CNC controller signals the actuator 43 to hold the pressure foot in this operating position.

The CNC controller directly or indirectly controls the slider cylinder 52, placing the pressure foot in a state for drilling operation or for tool changing.

The valve 54 is responsive to a Z-axis stroke signal from the CNC to pressurize the bladder cylinder 49 to clamp the clamp finger 47 against the work piece, or to relieve the pressure to release the clamp finger. The stroke signal occurs to actuate the spindle rotor linear motor to reciprocate the rotor through a drilling stroke. The stroke signal occurs at a rapid hit rate, e.g. upwards of 800 hits per minute in one exemplary embodiment. The hit rate can be lower or higher in a given application.

Possible advantages for exemplary embodiments of the drilling system architecture include one or more of the following.

1. Improved performance as a result of
   a. Higher drilling rate
   b. Improved machine dynamics
   c. Lower cost of producing boards
   d. Higher yields
   e. Improved accuracy
   f. Increased drill life
2. Reduced cost of producing the machine.
3. Common design that can be used for different sizes of machines (for example, 2, 4, 6, or 8 stations)
4. A machine that can be constructed in a slanted configuration to reduce footprint and simplify material loading and unloading.
5. Lower shipping cost due to lighter machine weight.

The new machine architecture can be utilized for a variety of drilling machine configurations, including for example a two-station very accurate machine, and a six-station or even larger station machine. The configurations can use common components to simplify production and reduce cost. The machine can be built in a slanted configuration to reduce footprint and improve ergonomics of material loading. The machine can, for example, be oriented with the table in a vertical position, or in an intermediate position between the horizontal table position and the vertical position. One suitable slanted orientation is with the table at a 35 degree orientation from the vertical.

Although the foregoing has been a description and illustration of specific embodiments of the invention, various modifications and changes thereto can be made by persons skilled in the art without departing from the scope and spirit of the invention as defined by the following claims.

The invention claimed is:

1. A drilling system, comprising:
   a stationary base table for supporting a work piece under process at a fixed position at a drilling spindle station;
   a drilling spindle for carrying and applying rotational force to a drilling tool;
   a compound overhead guiding system that carries the spindle above the work piece under process, said system including a Y-axis guiding structure for guiding movement of the spindle along a Y axis in relation to the base table, an X drive system for driving the spindle along an X axis which is orthogonal to said Y axis, and a Z axis drive system for driving the drilling tool along a Z axis which is orthogonal to said X and Y axis;
   said guiding system comprising a lightweight crossbeam structure for carrying the spindle and X axis drive system, said crossbeam structure comprising a laminated assembly comprising a first hollow structural element having high torsional strength and a second hollow structural element having high bending strength.

2. The system of claim 1, wherein the Z axis drive system comprises a linear Z-axis drive motor which acts on a spindle rotor to drive the rotor along the Z-axis relative to a stationary spindle body.

3. The system of claim 1, further comprising a Y-axis drive system coupled to the guiding system for driving the crossbeam structure in the Y-axis.

4. The system of claim 3, wherein the Y-axis drive system comprises a motor-driven leadscrew.

5. The system of claim 3, wherein the Y-axis drive system comprises a linear motor.

6. The system of claim 1, wherein the X-axis drive system comprises a leadscrew.

7. The system of claim 1, wherein the X-axis drive system comprises a linear motor.

8. The system of claim 1, wherein the compound overhead guiding system comprises:
a movable overhead Y-carriage structure which is bearing mounted relative to the base table for translating movement along the Y-axis.

9. The system of claim 1, wherein the guiding structure comprises a T-bar structure which includes:
a Y-carriage structure having a longitudinal extent along the Y axis; and
said crossbeam structure, wherein said crossbeam structure is perpendicularly attached to the Y-carriage structure and has a longitudinal extent along the X axis.

10. The system of claim 1, wherein the first hollow structural element comprises a thin-walled round tubing structure, and the second hollow structural element comprises a thin-walled square tubing structure, the round tubing structure fitted into the square tubing structure so that an outer surface of the round tubing structure is in tangential contact with an inner surface of the square tubing structure.

11. The system of claim 1, further comprising a low impact pressure foot system carried by said spindle for applying a clamping force against a surface of a work piece during a drilling stroke, the pressure foot system comprising:
a body structure which remains in a stationary position during each drilling stroke spaced above the work piece;
a movable clamp member carried by the body structure; and
an actuator for applying a clamp force to move the clamp member against the surface of the work piece at commencement of a drilling stroke and moving the clamp member away from the surface at the end of a drilling stroke.

12. The system of claim 11, wherein the clamp member is a relatively low mass finger element having an opening formed therein to allow passage of the drill bit during a drilling stroke, said finger element hingedly connected to the body structure.

13. The system of claim 12, wherein the actuator comprises a pneumatic valve and an inflatable bladder element, the valve for selectively inflating and deflating the bladder element to apply the clamp force.

14. A drilling system, comprising:
a stationary base table for supporting a plurality of work pieces under process at respective fixed positions at a drilling spindle station;
a plurality of drilling spindles each for carrying and applying rotational force to a drilling tool, the respective drilling spindles including a Z-axis drive system for applying reciprocating movement along a Z-axis to the drilling tool;
a compound overhead guiding system that carries the plurality of spindles above the work piece under process, said system including a Y-axis guiding structure for guiding movement of the spindles along a Y axis in relation to the base table, and an X drive system for driving the spindles along an X axis which is orthogonal to said Y axis;
said guiding system comprising a lightweight crossbeam structure for carrying the spindle and X axis drive system, said crossbeam structure comprising a laminated assembly comprising a first hollow structural element having high torsional strength and a second hollow structural element having high bending strength.

15. The system of claim 14, wherein the Z axis drive system comprises a linear Z-axis drive motor which acts on a spindle rotor to drive the rotor along the Z-axis relative to a stationary spindle body.

16. The system of claim 14, further comprising a Y-axis drive system coupled to the guiding system for driving the crossbeam structure in the Y-axis.

17. The system of claim 16, wherein the Y-axis drive system comprises a motor-driven leadscrew.

18. The system of claim 16, wherein the Y-axis drive system comprises a linear motor.

19. The system of claim 14, wherein the X-axis drive system comprises a leadscrew.

20. The system of claim 14, wherein the X-axis drive system comprises a linear motor.

21. The system of claim 14, wherein the compound overhead guiding system comprises:
a movable overhead Y-carriage structure which is bearing mounted relative to the base table for translating movement along the Y-axis.

22. The system of claim 14, wherein the guiding structure comprises a T-bar structure which includes:
a Y-carriage structure having a longitudinal extent along the Y axis; and
said crossbeam structure, wherein said crossbeam structure is perpendicularly attached to the Y-carriage structure and has a longitudinal extent along the X axis.

23. The system of claim 14, wherein the first hollow structural element comprises a thin-walled round tubing structure, and the second hollow structural element comprises a thin-walled square tubing structure, the round tubing structure fitted into the square tubing structure so that an outer surface of the round tubing structure is in tangential contact with an inner surface of the square tubing structure.

24. The system of claim 23, wherein the round tubing structure is fixed to the square tubing structure by an adhesive.

25. The system of claim 14, wherein the round tubing structure and the square tubing structure are fabricated of a steel.

26. The system of claim 25, wherein the round tubing structure has a nominal wall thickness of 0.060 inch, and the square tubing structure has a nominal wall thickness of 0.078 inch.

27. The system of claim 23, further comprising a dampening material disposed in spaces between the round tubing structure and the square tubing structure.

28. The system of claim 23, wherein the crossbeam structure further comprises a plate attached to an outer wall of the square tubing structure.

29. The system of claim 23, wherein the crossbeam structure further comprises an elastomer layer sandwiched between an outer wall of the square tubing structure and a plate extending along a longitudinal extent of the crossbeam.

30. The system of claim 29, wherein characteristics of the elastomer layer and the plate are tuned to increase a natural frequency of the crossbeam structure.

31. The system of claim 22, wherein the crossbeam structure is attached to the Y-carriage structure through a squaring plate structure.

32. The system of claim 22, further comprising first and second gosset members attached between the Y-carriage structure and the crossbeam to increase stiffness of the T-bar structure.

33. The system of claim 14, further comprising a plurality of low impact pressure foot systems, each carried by one of said plurality of spindles, each pressure foot system for applying a clamping force against a surface of a work piece during a drilling stroke, each pressure foot system comprising:
- a body structure which remains in a stationary position during each drilling stroke spaced above the work piece;
- a movable clamp member carried by the body structure; and
- an actuator for applying a clamp force to move the clamp member against the surface of the work piece at commencement of a drilling stroke and moving the clamp member away from the surface at the end of a drilling stroke.

34. The system of claim 33, wherein the clamp member is a relatively low mass finger element having an opening formed therein to allow passage of the drill bit during a drilling stroke, said finger element hingedly connected to the body structure.

35. The system of claim 34, wherein the actuator comprises a pneumatic valve and an inflatable bladder element, the valve for selectively inflating and deflating the bladder element to apply the clamp force.

36. The system of claim 33, further comprising a Z-axis actuator for moving the pressure foot body along the Z-axis relative to the spindle to position the pressure clamp member at a position spaced by a distance from the work piece surface during a work piece drilling sequence.

37. The system of claim 36, wherein said Z-axis actuator is responsive to a sensor signal to stop the movement of the pressure foot body at said distance.

38. The system of claim 37, wherein said distance is 0.020 inch or smaller.

39. A low impact pressure foot system for a drilling spindle for applying a clamping force against a surface of a work piece during a drilling stroke, the pressure foot system comprising:
- a body structure which remains in a stationary position during each drilling stroke relative to the work piece;
- a movable clamp member carried by the body structure;
- a sensor for detecting and generating a sensor signal indicative of a close proximity or contact condition of the movable clamp member relative to the surface of the work piece; and
- an actuator system for moving the movable clamp member toward the surface of the work piece under a low impact force until the clamp member comes into contact with the surface of the work piece, and in response to said sensor signal, while holding the clamp member in a substantially stationary position relative to the surface of the work piece, applying a clamp force greater than said low impact force with the clamp member against the surface of the work piece during a drilling stroke, and for moving the clamp member away from the surface at the end of a drilling stroke.

40. A low impact pressure foot system for a drilling spindle for applying a clamping force against a surface of a work piece during a drilling stroke, the pressure foot system comprising:
- a body structure which remains in a stationary position during each drilling stroke relative to the work piece;
- a movable clamp member carried by the body structure, wherein the clamp member is a relatively low mass finger element having an opening formed therein to allow passage of the drill bit during a drilling stroke, said finger element hingedly connected to the body; and
- an actuator for applying a clamp force to move the clamp member against the surface of the work piece at commencement of a drilling stroke and moving the clamp member away from the surface at the end of a drilling stroke.

41. A low impact pressure foot system for a drilling spindle for applying a clamping force against a surface of a work piece during a drilling stroke, the pressure foot system comprising:
- a body structure which remains in a stationary position during each drilling stroke relative to the work piece;
- a movable clamp member carried by the body structure; and
- an actuator for applying a clamp force to move the clamp member against the surface of the work piece at commencement of a drilling stroke and moving the clamp member away from the surface at the end of a drilling stroke, wherein the actuator comprises a pneumatic valve and an inflatable bladder element, the valve for selectively inflating and deflating the bladder element to apply the clamp force.

42. A low impact pressure foot system for a drilling spindle for applying a clamping force against a surface of a work piece during a drilling stroke, the pressure foot system comprising:
- a body structure which remains in a stationary position during each drilling stroke relative to the work piece;
- a movable clamp member carried by the body structure;
- an actuator for applying a clamp force to move the clamp member against the surface of the work piece at commencement of a drilling stroke and moving the clamp member away from the surface at the end of a drilling stroke; and
- a Z-axis actuator for moving the pressure foot body along the Z-axis relative to the spindle to position the pressure clamp member at a position spaced by a distance from the work piece surface during a work piece drilling sequence.

43. The system of claim 42, wherein said Z-axis actuator is responsive to a sensor signal to stop the movement of the pressure foot body at said distance.

44. A drilling system, comprising:
- a stationary base table for supporting a work piece under process at a fixed position at a drilling spindle station;
- a drilling spindle for carrying and applying rotational force to a drilling tool;
- a compound overhead guiding system that carries the spindle above the work piece under process, said system including a Y-axis guiding structure for guiding movement of the spindle along a Y axis in relation to the base table, an X drive system for driving the spindle along an X axis which is orthogonal to said Y axis, and a Z axis drive system for driving the drilling tool along a Z axis which is orthogonal to said X and Y axis;
- said guiding system comprising a lightweight crossbeam structure for carrying the spindle and X axis drive system, said crossbeam structure comprising a laminated assembly having a high stiffness-to-weight ratio in relation to a cast iron crossbeam construction.

45. The system of claim 44, wherein the Z axis drive system comprises a linear Z-axis drive motor which acts on a spindle rotor to drive the rotor along the Z-axis relative to a stationary spindle body.

46. The system of claim 44, wherein the compound overhead guiding system comprises:
a movable overhead Y-carriage structure which is bearing mounted relative to the base table for translating movement along the Y-axis.

47. The system of claim 44, wherein the guiding structure comprises a T-bar structure which includes:
a Y-carriage structure having a longitudinal extent along the Y axis; and
said crossbeam structure, wherein said crossbeam structure is perpendicularly attached to the Y-carriage structure and has a longitudinal extent along the X axis.

48. The system of claim 44, wherein the crossbeam structure comprises a first hollow structural element comprising a thin-walled round tubing structure, and a second hollow structural element comprising a thin-walled square tubing structure, the round tubing structure fitted into the square tubing structure so that an outer surface of the round tubing structure is in tangential contact with an inner surface of the square tubing structure.

49. The system of claim 44, further comprising a low impact pressure foot system carried by said spindle for applying a clamping force against a surface of a work piece during a drilling stroke, the pressure foot system comprising:
a body structure which remains in a stationary position during each drilling stroke spaced above the work piece;
a movable clamp member carried by the body structure; and
an actuator for applying a clamp force to move the clamp member against the surface of the work piece at commencement of a drilling stroke and moving the clamp member away from the surface at the end of a drilling stroke.

50. The system of claim 49, wherein the clamp member is a relatively low mass finger element having an opening formed therein to allow passage of the drill bit during a drilling stroke, said finger element hingedly connected to the body structure.

51. The system of claim 49, wherein the actuator comprises a pneumatic valve and an inflatable bladder element, the valve for selectively inflating and deflating the bladder element to apply the clamp force.

52. The system of claim 39, wherein said actuator comprises a pneumatic actuator, and said sensor signal triggers an increase in pressure from a low pressure in said actuator to a high pressure in said actuator to apply said clamping force.

* * * * *